United States Patent
Doglio (10) Patent No.: US 11,324,137 B2
(45) Date of Patent: May 3, 2022

(54) SYSTEMS AND METHODS FOR MOUNTING AIR MOVER TO CREATE THERMAL SEAL AND MINIMIZE VIBRATIONAL NOISE

(71) Applicant: Dell Products L.P., Round Rock, TX (US)

(72) Inventor: Jean Marie Doglio, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 241 days.

(21) Appl. No.: 16/000,222

(22) Filed: Jun. 5, 2018

(65) Prior Publication Data

US 2019/0373764 A1    Dec. 5, 2019

(51) Int. Cl.
*H05K 7/20* (2006.01)
*G06F 1/20* (2006.01)

(52) U.S. Cl.
CPC .......... *H05K 7/20145* (2013.01); *G06F 1/20* (2013.01); *H05K 7/20172* (2013.01)

(58) Field of Classification Search
CPC ... H05K 7/20145; H05K 7/20172; G06F 1/20
See application file for complete search history.

(56) References Cited

U.S. PATENT DOCUMENTS

| | | | | |
|---|---|---|---|---|
| 6,244,953 B1* | 6/2001 | Dugan | ............... | H05K 7/20172 361/695 |
| 6,674,641 B2* | 1/2004 | Jensen | ....................... | G06F 1/18 165/80.3 |
| 7,021,895 B2* | 4/2006 | Rubenstein | ........... | F04D 25/166 415/207 |
| 7,515,413 B1* | 4/2009 | Curtis | ....................... | G06F 1/20 165/104.33 |
| 8,800,951 B2* | 8/2014 | Sun | ........................... | G06F 1/20 248/628 |
| 2006/0285292 A1* | 12/2006 | Fan | ..................... | H05K 7/20172 361/695 |
| 2012/0163971 A1* | 6/2012 | Chiu | ..................... | F04D 29/601 415/213.1 |
| 2014/0252197 A1* | 9/2014 | Doglio | ............... | H05K 7/20172 248/562 |
| 2016/0245307 A1* | 8/2016 | Sauer | .................... | F04D 29/601 |

* cited by examiner

Primary Examiner — Steven B McAllister
Assistant Examiner — Charles R Brawner
(74) Attorney, Agent, or Firm — Jackson Walker L.L.P.

(57) ABSTRACT

An air mover assembly may be configured such that during insertion of the assembly into an air mover gantry, one or more spring features integral to the gantry apply a first spring force opposite to a direction of insertion of the assembly relative to the gantry in order to maintain the assembly in an unseated position until the first spring force is overcome by an opposite force to fully seat assembly into the gantry and when the assembly is fully seated within the gantry, the one or more spring features integral to the gantry apply a second spring force to the assembly in a direction of air flow through an air mover of the assembly that biases an exhaust portion of the air mover toward a face of the gantry opposite of the one or more spring features.

10 Claims, 7 Drawing Sheets

SYSTEMS AND METHODS FOR MOUNTING AIR MOVER TO CREATE THERMAL SEAL AND MINIMIZE VIBRATIONAL NOISE

TECHNICAL FIELD

The present disclosure relates in general to information handling systems, and more particularly to mounting an air mover in an information handling system to create a thermal seal between the air mover and a chassis of the information handling system and minimize vibrational noise caused by intermittent content between the air mover and the chassis.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

One challenge in chassis design is controlling the interface between air movers and the chassis in a way that provides a secure and predictable interface. In existing approaches, air mover mounting may include an air mover with an air mover carrier docked to an electrical connector on a printed circuit board, and "floating" in a slot of an air mover gantry. The air mover gantry interface gaps are sized to allow clearances sufficient for easy installation and proper mating between connectors. A latch point on one side may retain the air mover assembly to the gantry, providing the only predictable connection. The front, back, and sides of the air mover assembly may or may not be touching the gantry depending on part tolerances and variations in installation. This situation may be disadvantageous for several reasons. First, fans which are minimally constrained tend to input more vibration energy into the chassis, which can adversely affect hard disk drive performance. Also, vibration transmission is less predictable when the mounting interface is inconsistent. Second, with an uncontrolled assembly fit, the assembly may end up with intermittent contact with the chassis, which allows parts to rattle against each other and create acoustical tones that negatively affect customer experience. Third, gaps between air movers and air mover gantries may create a path for airflow recirculation, thus limiting the maximum airflow potential that the system could have.

SUMMARY

In accordance with the teachings of the present disclosure, the disadvantages and problems associated traditional approaches to mounting air movers in an information handling system may be substantially reduced or eliminated.

In accordance with embodiments of the present disclosure, an information handling system may include a chassis and an air mover gantry mechanically coupled to the chassis and defining a bay including an opening for receiving an air mover assembly into the bay. The air mover gantry may comprise one or more first locating features configured such that when the air mover assembly is fully inserted into the bay, the first locating features mechanically interact with respective second locating features of the air mover assembly in order to retain the air mover assembly in a substantially fixed position relative to the air mover gantry and one or more spring features located within the bay and opposite the opening. The one or more spring features may be configured to during insertion of the air mover assembly into the air mover gantry, apply a first spring force opposite to a direction of insertion of the air mover assembly relative to the air mover gantry in order to maintain the air mover assembly in an unseated position until the first spring force is overcome by an opposite force to fully seat the air mover assembly into the air mover gantry, and when the air mover assembly is fully seated within the air mover gantry, apply a second spring force to the air mover assembly in a direction of air flow through an air mover of the air mover assembly that biases an exhaust portion of the air mover toward a face of the air mover gantry opposite of the one or more spring features.

In accordance with these and other embodiments of the present disclosure, an air mover gantry defining a bay including an opening for receiving an air mover assembly into the bay, may include one or more first locating features configured such that when the air mover assembly is fully inserted into the bay, the first locating features mechanically interact with respective second locating features of the air mover assembly in order to retain the air mover assembly in a substantially fixed position relative to the air mover gantry and one or more spring features located within the bay and opposite the opening. The one or more spring features may be configured to during insertion of the air mover assembly into the air mover gantry, apply a first spring force opposite to a direction of insertion of the air mover assembly relative to the air mover gantry in order to maintain the air mover assembly in an unseated position until the first spring force is overcome by an opposite force to fully seat the air mover assembly into the air mover gantry and when the air mover assembly is fully seated within the air mover gantry, apply a second spring force to the air mover assembly in a direction of air flow through an air mover of the air mover assembly that biases an exhaust portion of the air mover toward a face of the air mover gantry opposite of the one or more spring features.

In accordance with these and other embodiments of the present disclosure, an air mover assembly may include an air mover and a carrier mechanically coupled to the air mover, wherein the air mover assembly comprises one or more first locating features configured such that when the air mover assembly is fully inserted into a bay defined by an air mover gantry, the first locating features mechanically interact with respective second locating features of the air mover gantry in order to retain the air mover assembly in a substantially fixed position relative to the air mover gantry. The air mover assembly may be configured such that during insertion of the air mover assembly into the air mover gantry, one or more spring features integral to the air mover gantry apply a first spring force opposite to a direction of insertion of the air mover assembly relative to the air mover gantry in order to maintain the air mover assembly in an unseated position until the first spring force is overcome by an opposite force to fully seat the air mover assembly into the air mover gantry and when the air mover assembly is fully seated within the air mover gantry, the one or more spring features integral to the air mover gantry apply a second spring force to the air mover assembly in a direction of air flow through an air mover of the air mover assembly that biases an exhaust portion of the air mover toward a face of the air mover gantry opposite of the one or more spring features.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 3B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, input-output devices and/or interfaces, storage resources, network interfaces, motherboards, integrated circuit packages; electro-mechanical devices (e.g., air movers), displays, and power supplies.

Figure 1:
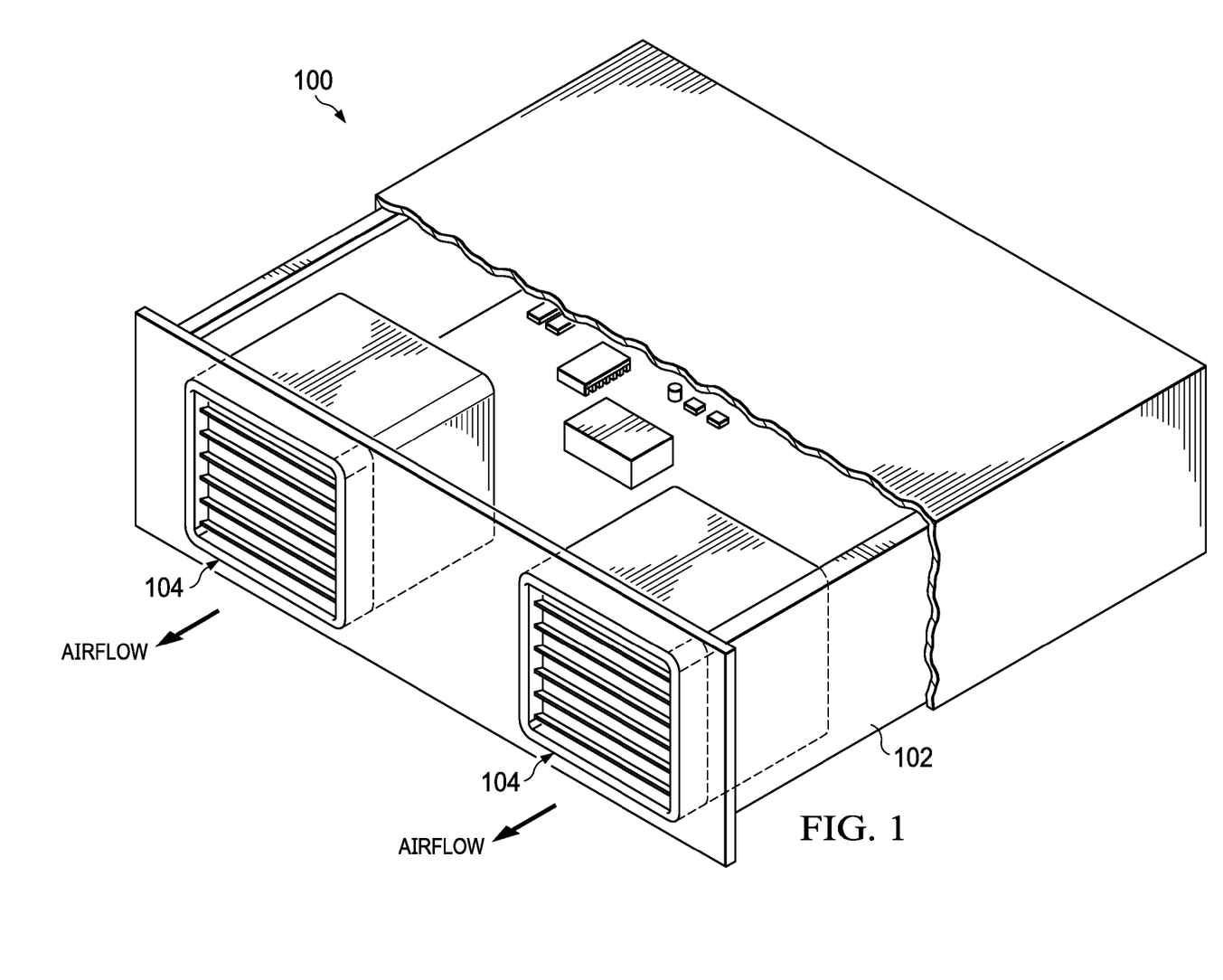
FIG. 1 illustrates a block diagram of an example information handling system having one or more air mover assemblies for cooling information handling resources, in accordance with the present disclosure.

FIG. 1 illustrates a block diagram of an example information handling system 100 having one or more air mover assemblies 104 for cooling information handling resources of information handling system 100, in accordance with the present disclosure. In some embodiments, an information handling system 100 may comprise a server chassis configured to house a plurality of servers or "blades." In other embodiments, information handling system 100 may comprise a personal computer (e.g., a desktop computer, laptop computer, mobile computer, and/or notebook computer). In yet other embodiments, information handling system 100 may comprise a storage enclosure configured to house a plurality of physical disk drives and/or other computer-readable media for storing data.

As depicted in FIG. 1, information handling system 100 may include a chassis 102 having a plurality of air mover assemblies 104. Chassis 102 may be an enclosure that serves as a container for various information handling resources of information handling system 100, and may be constructed from steel, aluminum, plastic, and/or any other suitable material. Although the term "chassis" is used, chassis 102 may also be referred to as a case, cabinet, tower, box, enclosure, and/or housing.

Each of air mover assemblies 104 may be any mechanical or electro-mechanical system, apparatus, or device operable to move air and/or other gases. In certain embodiments, air mover assemblies 104 may draw cool air into chassis 102 from the outside, expel warm air from inside chassis 102, and/or move air across one or more heatsinks (not explicitly shown) internal to chassis 102 to cool one or more information handling resources of information handling system 100. The structure and function of air mover assemblies 104 may be described in greater detail below with respect to FIGS. 2A-2D, 3A, and 3B.

Although information handling system 100 is depicted as including two air mover assemblies 104, information handling system 100 may include any number of air mover assemblies 104. In addition, although a particular configuration of air mover assemblies 104 is depicted, air mover assemblies 104 may be configured in any suitable manner.

Figure 2A:
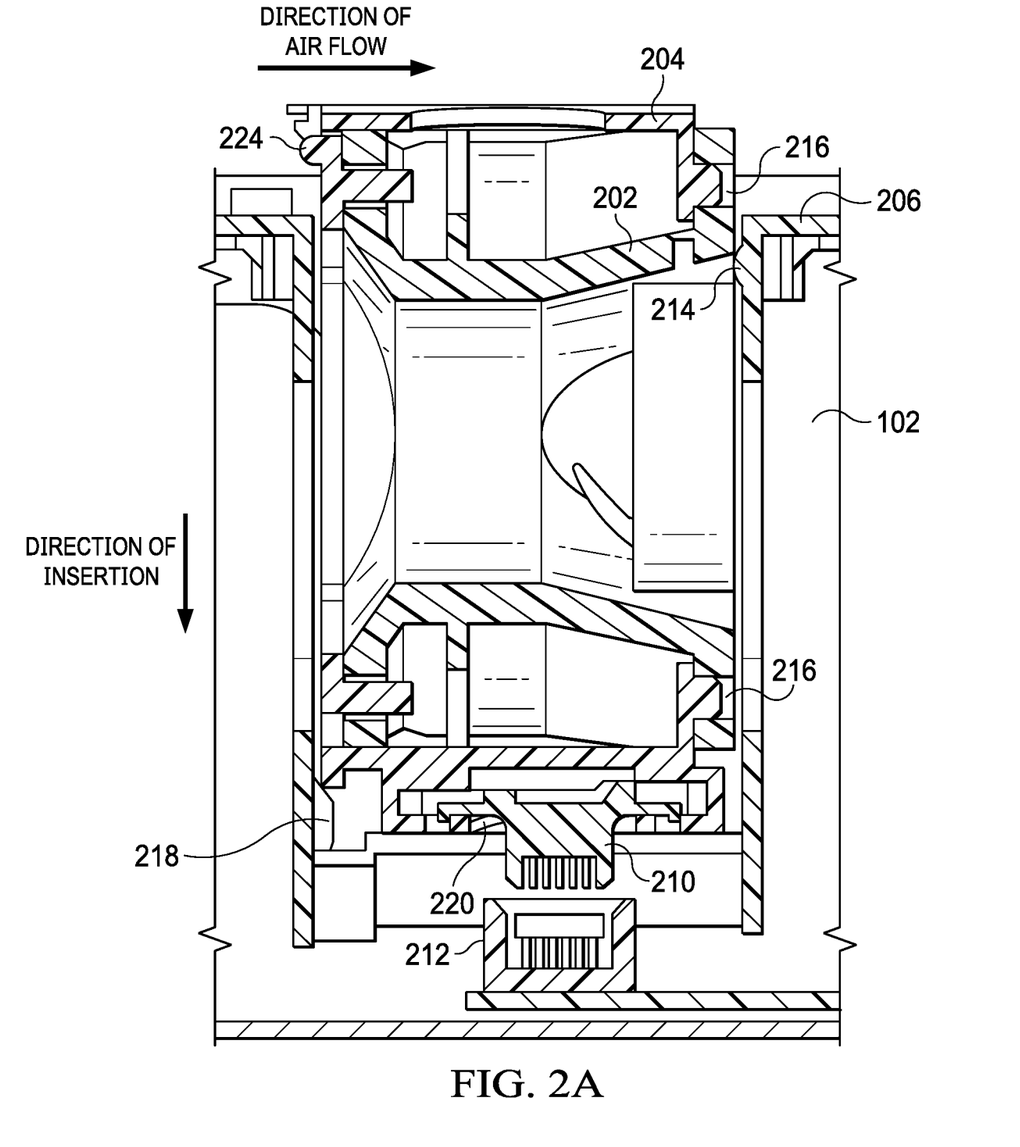
FIGS. 2A-2D illustrate various schematic cross-sectional views depicting insertion of an air mover into an information handling system chassis, in accordance with the present disclosure.
Figure 2B:
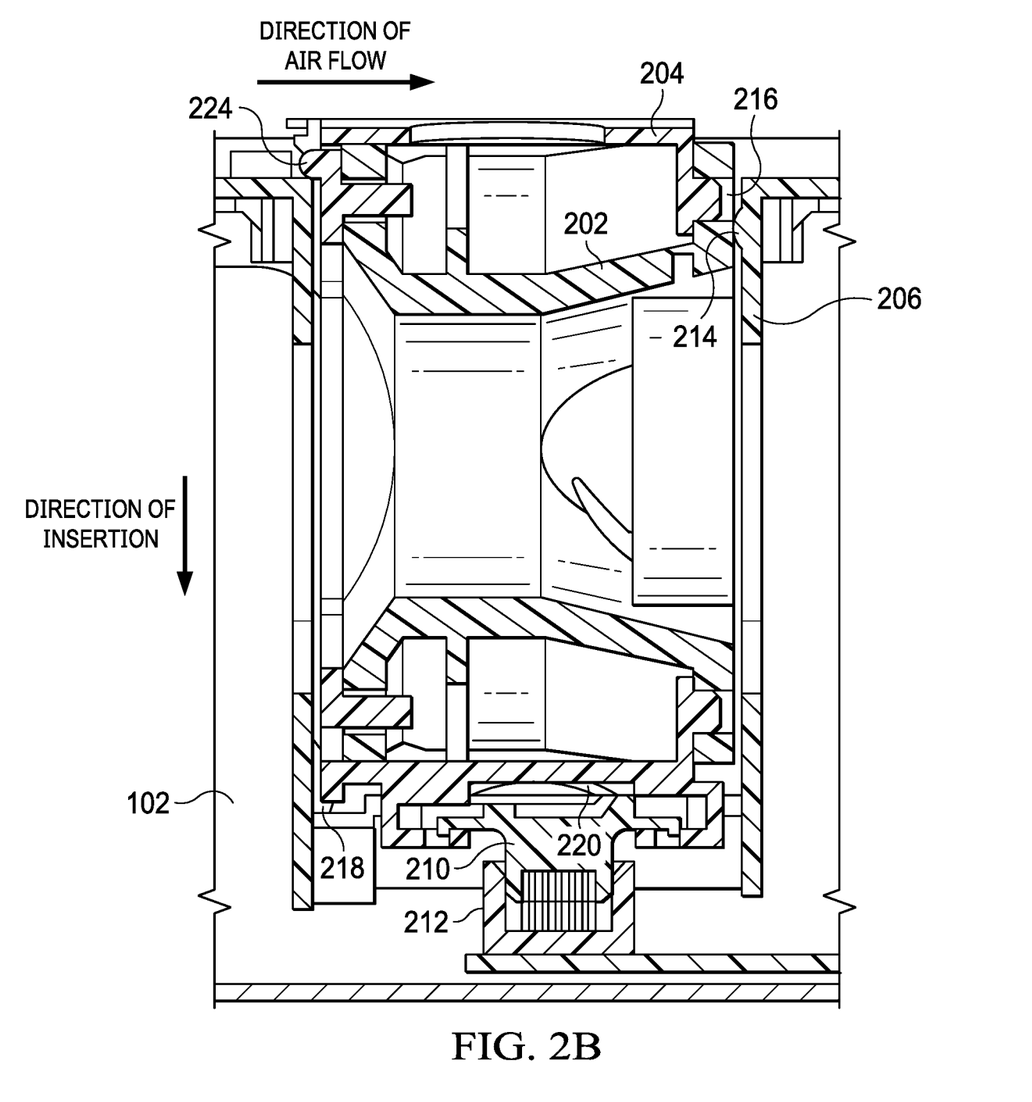
Figure 2C:
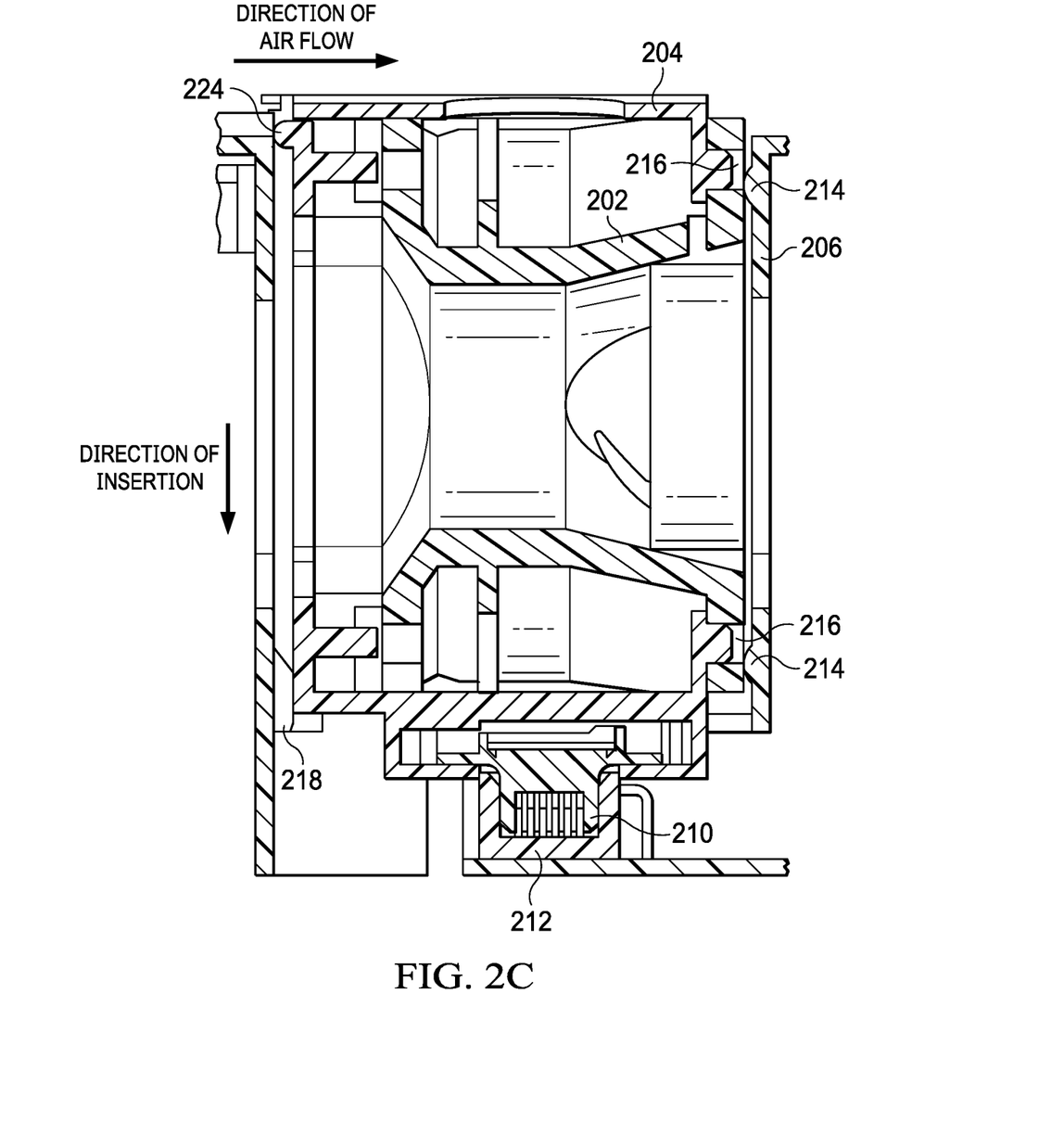

FIGS. 2A-2D illustrate various schematic cross-sectional views depicting insertion of an air mover 202 into information handling system chassis 102, in accordance with the present disclosure. FIGS. 3A and 3B illustrate various schematic perspective views of selected components present in FIGS. 2A-2D, in accordance with the present disclosure.

As shown in FIGS. 2A-3B, an air mover assembly comprising an air mover 202 and an air mover carrier 204 mechanically coupled to air mover 202 may be inserted into a bay defined by an air mover gantry 206 mechanically coupled to chassis 102, wherein air mover gantry 206 serves as a guiding mechanism in order that, as the air mover assembly is inserted in the direction of insertion indicated in FIGS. 2A-2D, air mover gantry 206 guides the air mover assembly to ensure that once the air mover assembly is fully inserted, an electrical connector 210 of air mover 202 electrically and mechanically mates to a corresponding connector 212 (e.g., on a printed circuit board disposed within chassis 102). FIGS. 2A-2D may thus depict a chronology of positions of the air mover assembly with respect to air mover gantry 206 during insertion of the air mover assembly into air mover gantry 206, beginning with insertion of the end of the air mover assembly including connector 210 through an opening of air mover gantry 206 opposite of connector 212, and mechanical translation of the air mover assembly in the direction of insertion under the mechanical force of a person (e.g., insertion by hand), a tool, or a machine for inserting the air mover assembly.

As shown in FIGS. 2A-3B, air mover gantry 206 may include one or more spring features 218 located opposite of the opening of air mover gantry 206 on a first face of air mover gantry 206 parallel to the direction of insertion, one or more spring features 220 located opposite of the opening of air mover gantry 206 proximate to a bottom of air mover gantry 206 perpendicular to the direction of insertion, and one or more detents 214 on a second face of air mover gantry 206 opposite the first face. Also as shown in FIGS. 2A-3B, air mover 202 and/or air mover carrier 204 may include locating holes 216, and one or more spring features 224. Functionality of these various features is described in more detail below.

Figure 2D:
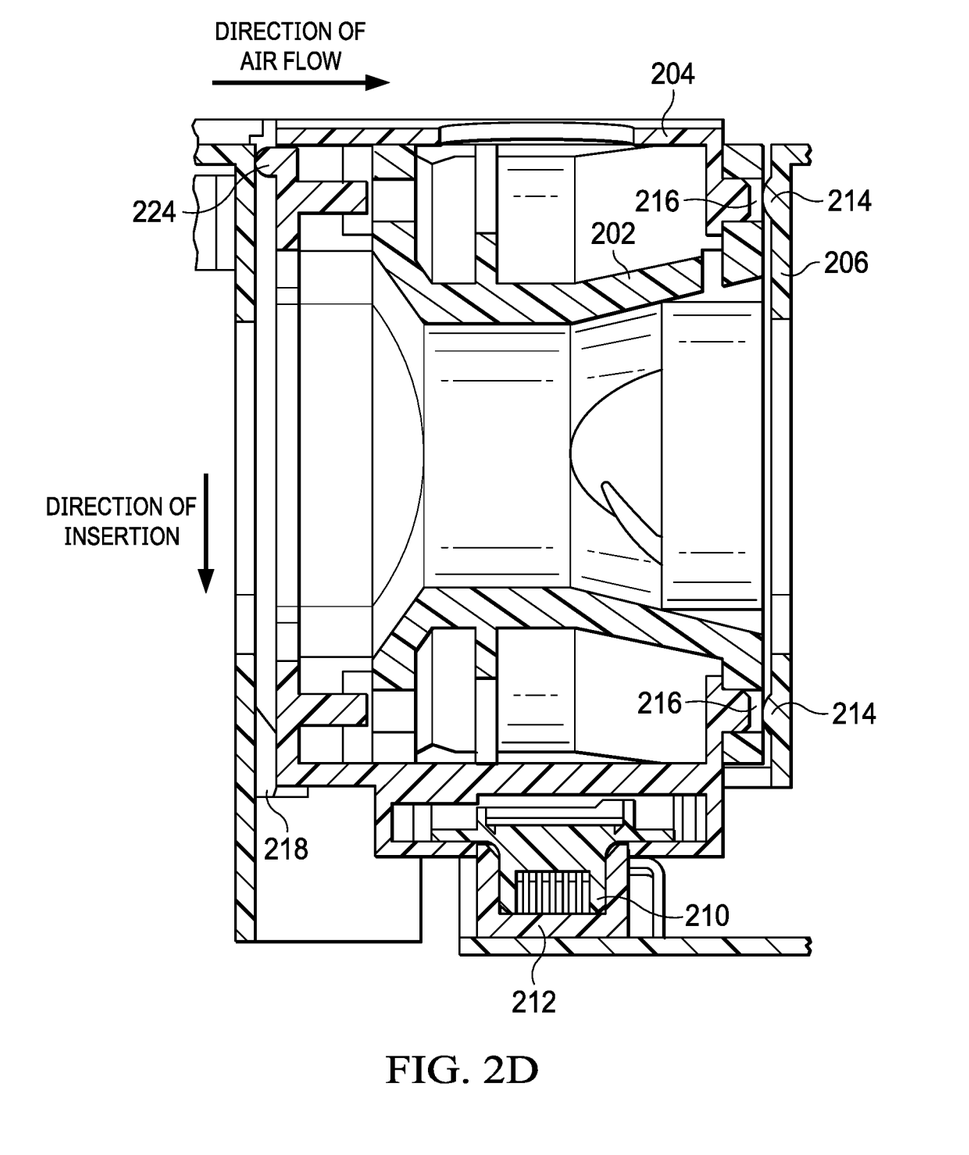
Figure 3A:
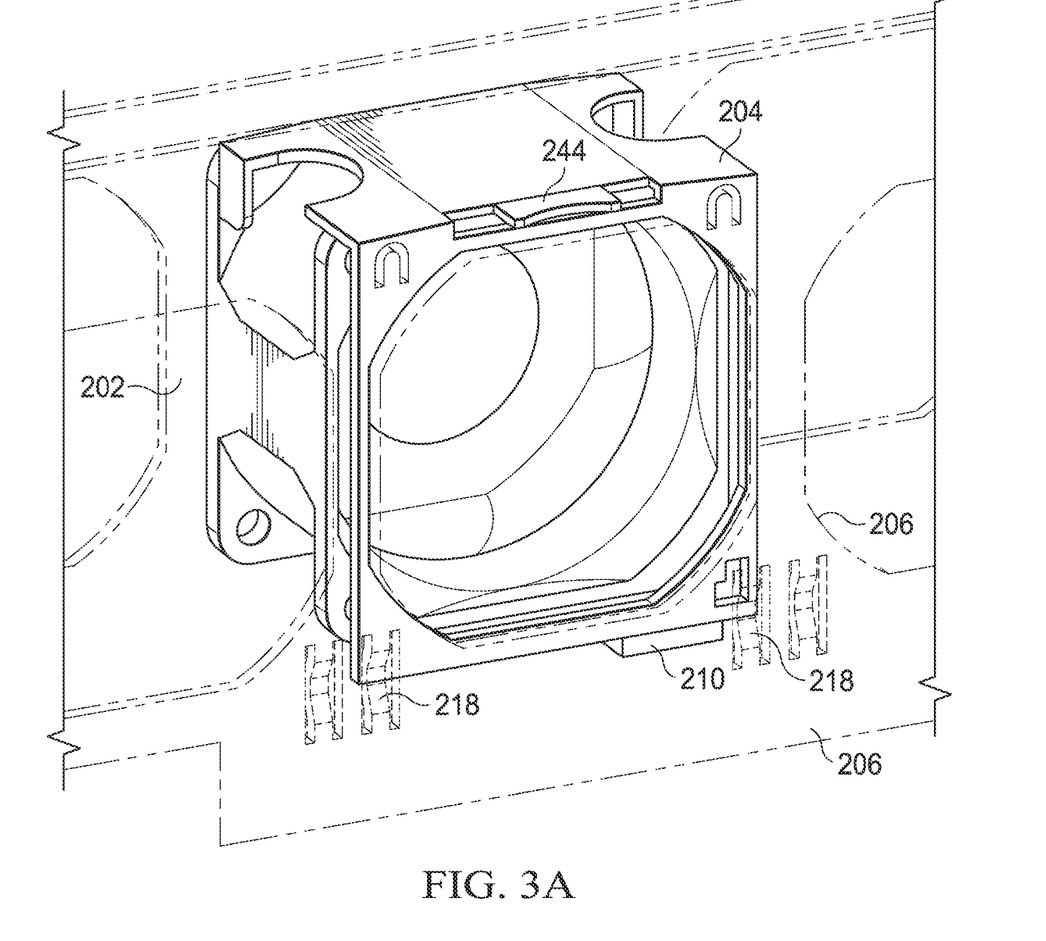
FIGS. 3A and 3B illustrate various schematic perspective views of selected components present in FIGS. 2A-2D, in accordance with the present disclosure.
Figure 3B:
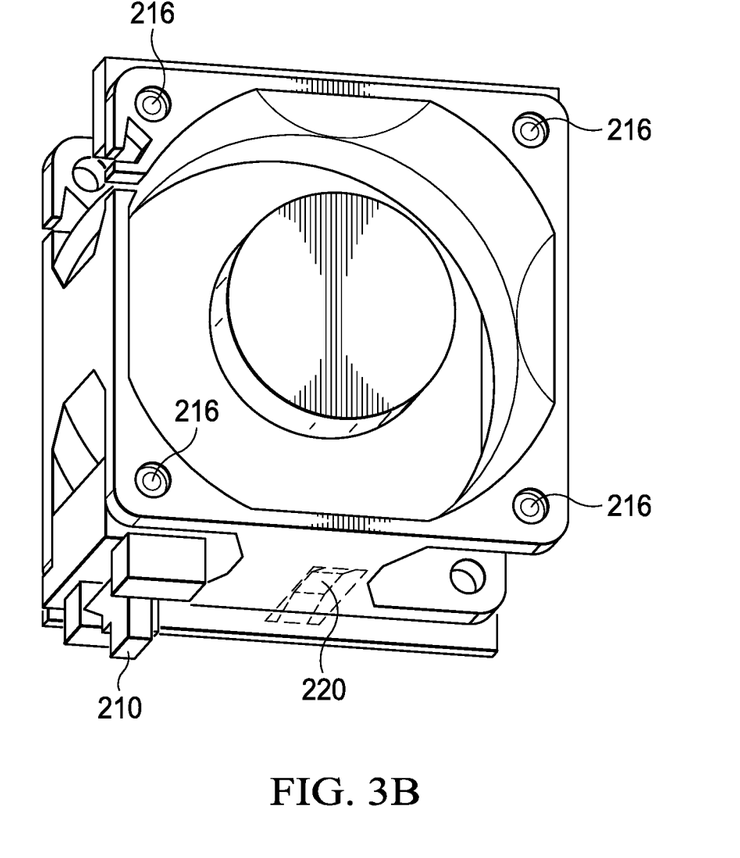

Detents 214 and locating holes 216 may be sized, shaped, configured, and placed on air mover gantry 206 and the air mover assembly such that when the air mover assembly is fully inserted into the bay defined by air mover gantry 206, each detent 214 may mechanically engage with a corresponding locating hole 216 to retain the air mover assembly in a substantially fixed position relative to air mover gantry 206, as shown in FIG. 2D. Although detents 214 and locating holes 216 are depicted in FIGS. 2A-3B, other suitable mechanical locating features other than detents 214 and corresponding locating holes 216 may be used.

Spring features 218 may be located within air mover gantry 206 and configured in order to, during insertion of the air mover assembly into air mover gantry 206, provide a spring force opposite to the direction of insertion in order hold the air mover assembly in an unseated position as shown in FIG. 2A. A user may apply a force in the direction of insertion to overcome the spring force opposite of the direction of insertion of spring features 218 and fully seat the air mover assembly within air mover gantry 206 as shown in FIG. 2D. While spring features 218 are shown in FIGS. 2A-3B as leaf springs, spring features 218 may comprise any suitable type of spring for carrying out the functionality disclosed herein.

Spring features 218 may also be located within air mover gantry 206 and configured in order to, once the air mover assembly is fully seated within air mover gantry 206, apply a force to the air mover assembly in a direction of air flow as shown in FIGS. 2A-2D, and thus may provide a force that biases an exhaust portion of air mover 202 toward a face (e.g., the face of air mover gantry 206 comprising detents 214) of air mover gantry 206 opposite of spring features 218.

Spring features 224 may be located within the air mover assembly (e.g. on air mover carrier 204) and configured in order to, once the air mover assembly is fully seated within air mover gantry 206, apply a force to the air mover assembly in a direction of air flow as shown in FIGS. 2A-2D, and thus may provide a force that biases an exhaust portion of air mover 202 toward a face (e.g., the face of air mover gantry 206 comprising detents 214) of air mover gantry 206 opposite of spring features 218. While spring features 224 are shown in FIGS. 2A-3B as a particular type of spring, spring features 224 may comprise any suitable type of spring for carrying out the functionality disclosed herein.

Together, the spring forces provided by spring features 218 and spring features 224 may create a fluid seal between the exhaust of air mover 202 and air mover gantry 206 at the face of air mover gantry 206 which includes detents 214.

Once the air mover assembly is fully seated within air mover gantry 206, other than the seal created between the air mover assembly and air mover gantry 206, and the points of contact between the air mover assembly and air mover gantry 206 proximate to spring features 218 and 224, clearance gaps may be present on the top, bottom, and sides of air mover 202 to ensure that surfaces of air mover 202 and air mover carrier 204 do not come in contact with air mover gantry 206.

A latch such as latch 244 and one or more other spring and/or compliance features may be present within the air mover assembly and/or air mover gantry 206 to retain positioning of the air mover assembly relative to air mover gantry 206 during a mechanical shock event.

Spring feature 220 may be located within air mover gantry 206 and configured in order to provide a spring force opposite of the direction of insertion. When the air mover assembly is fully inserted within air mover gantry 206 and a latch is engaged, a retention force of the latch may overcome the spring force of spring feature 220 such that the air mover assembly is maintained in the fully inserted position within air mover gantry 206. When the latch is released, the spring force of spring feature 220 may cause the air mover assembly to lift within air mover gantry 206 in a direction opposite of the direction of insertion, to a position (e.g., the position shown in FIG. 2A) wherein the air mover assembly presents itself to a user for removal. In other embodiments in which a latch is not present, the spring force of spring feature 220 may be strong enough to provide assistance to a user in removing the air mover assembly from air mover gantry 206, but not strong enough to overcome the mechanical interactions between detents 214 and locating holes 216.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system comprising:
    a chassis; and
    an air mover gantry mechanically coupled to the chassis and defining a bay including an opening for receiving an air mover assembly into the bay, wherein the air mover assembly includes an air mover and a carrier mechanically coupled to the air mover, and wherein the air mover gantry comprises;
        one or more first locating features configured such that when the air mover assembly is fully inserted in to the bay, the first locating features mechanically interact with respective second locating features of the air mover assembly in order to align the air mover assembly in a fixed position relative to the air mover gantry, wherein the one or more first locating features comprise detents configured to mechanically interact with locating holes of the one or more second locating features, the locating holes being disposed in the carrier, by sliding across a face of the air mover assembly that includes the locating holes during insertion and engaging with the locating holes when the air mover assembly is fully inserted in to the bay; and
        a plurality of springs located within the bay and opposite the opening and configured to:
            during insertion of the air mover assembly into the air mover gantry, apply a first spring force opposite to a direction of insertion of the air mover assembly relative to the air mover gantry and perpendicular to a direction of insertion of the air mover assembly relative to the air mover gantry and perpendicular to a direction of airflow through an air mover of the air mover assembly in order to maintain the air mover assembly in an unseated position until the first spring force is overcome by an opposite force to fully seat the air mover assembly into the air mover gantry, such that an electrical connector of the air mover is electrically and mechanically mated to a corresponding connector of the information handling system during insertion; and
            when the air mover assembly is fully seated within the air mover gantry, apply a second spring force to the air mover assembly in the direction of air flow that biases an exhaust portion of the air mover toward a face of the air mover gantry opposite of the plurality of springs and retains the detents in the locating holes.

2. The information handling system of claim 1, wherein at least one of the plurality of springs comprises a leaf spring.

3. The information handling system of claim 1, the air mover gantry further comprising a second spring having a second spring force opposite to the direction of insertion.

4. The information handling system of claim 3, wherein the air mover gantry further comprises one or more mechanical features for mechanically interacting with a latch integral to the air mover assembly, such that when the air mover assembly is fully seated within the air mover gantry and the latch is engaged, a retention force of the latch and the one or more mechanical features overcomes the second spring force to retain the air mover assembly in a fixed position relative to the air mover gantry.

5. The information handling system of claim 4, wherein when the air mover assembly is fully seated within the air mover gantry and the latch is released, the second spring force is configured to cause the air mover assembly to move within the air mover gantry in a direction opposite of the direction of insertion.

6. An air mover gantry defining a bay including an opening for receiving an air mover assembly into the bay, the air mover assembly including an air mover and a carrier mechanically coupled to the air mover, wherein the air mover gantry comprises:
    one or more first locating features configured such that when the air mover assembly is fully inserted into the bay, the first locating features mechanically interact with respective second locating features of the air mover assembly in order to align the air mover assembly in a fixed position relative to the air mover gantry, wherein the one or more first locating features comprise detents configured to mechanically interact with locating holes of the one or more second locating features, the locating holes being disposed in the carrier, by sliding across a face of the air mover assembly that includes the locating holes during insertion and engaging with the locating holes when the air mover assembly is fully inserted into the bay;
    and a plurality of springs located within the bay and opposite the opening and configured to:
        during insertion of the air mover assembly into the air mover gantry, apply a first spring force opposite to a direction of insertion of the air mover assembly relative to the air mover gantry and perpendicular to a direction of air flow through an air mover of the air mover assembly in order to maintain the air mover assembly in an unseated position until the first spring force is overcome by an opposite force to fully seat the air mover assembly into the air mover gantry, such that an electrical connector of the air mover is electrically and mechanically mated to a corresponding connector during insertion; and
        when the air mover assembly is fully seated within the air mover gantry, apply a second spring force to the air mover assembly in the direction of air flow that biases an exhaust portion of the air mover toward a face of the air mover gantry opposite of the plurality of springs and retains the detents in the locating holes.

7. The air mover gantry of claim 6, wherein at least one of the plurality of springs comprises a leaf spring.

8. The air mover gantry of claim 6, further comprising a second spring feature having a second spring force opposite to the direction of insertion.

9. The air mover gantry of claim 8, further comprising one or more mechanical features for mechanically interacting with a latch integral to the air mover assembly, such that when the air mover assembly is fully seated within the air mover gantry and the latch is engaged, a retention force of the latch and the one or more mechanical features overcomes the second spring force to retain the air mover assembly in a fixed position relative to the air mover gantry.

10. The air mover gantry of claim 9, wherein when the air mover assembly is fully seated within the air mover gantry and the latch is released, the second spring force causes the air mover assembly to move within the air mover gantry in a direction opposite of the direction of insertion.

\* \* \* \* \*

UNITED STATES PATENT AND TRADEMARK OFFICE
CERTIFICATE OF CORRECTION

| | |
|---|---|
| PATENT NO. | : 11,324,137 B2 |
| APPLICATION NO. | : 16/000222 |
| DATED | : May 3, 2022 |
| INVENTOR(S) | : Jean Marie Doglio |

It is certified that error appears in the above-identified patent and that said Letters Patent is hereby corrected as shown below:

In the Claims

In Claim 1, Column 7, Lines 49-51, delete "perpendicular to a direction of insertion of the air mover assembly relative to the air mover gantry and perpendicular to a direction of airflow through" and insert -- perpendicular to a direction of air flow through --, therefor.

Signed and Sealed this
Twenty-second Day of November, 2022

Katherine Kelly Vidal
*Director of the United States Patent and Trademark Office*